United States Patent [19]

Min et al.

[11] Patent Number: 4,853,559

[45] Date of Patent: Aug. 1, 1989

[54] HIGH VOLTAGE AND POWER BICMOS DRIVING CIRCUIT

[75] Inventors: Sung-Ki Min, Inchon; Jae S. Lee, Kyunggi, both of Rep. of Korea

[73] Assignee: Samsung Semiconductor and Telecommunications Co., Ltd., Gumi, Rep. of Korea

[21] Appl. No.: 144,933

[22] Filed: Jan. 15, 1988

[30] Foreign Application Priority Data

Jan. 24, 1987 [KR] Rep. of Korea ............... 87-579[U]

[51] Int. Cl.$^4$ ................... H03K 3/26; H03K 3/01; H03K 17/60

[52] U.S. Cl. ................. 307/270; 307/296.4; 307/296.5; 307/446; 307/570

[58] Field of Search ............... 307/296.4, 296.5, 270, 307/570, 446, 315; 361/86

[56] References Cited

U.S. PATENT DOCUMENTS

| | | | |
|---|---|---|---|
| 3,725,678 | 4/1973 | Reddy | 307/296.4 |
| 4,322,634 | 3/1982 | Kaire et al. | 361/92 |
| 4,424,457 | 1/1984 | Leuthold | 307/296.4 |
| 4,481,430 | 11/1984 | Houk et al. | 307/296.4 |
| 4,701,635 | 10/1987 | Kawazoe et al. | 307/270 |
| 4,716,489 | 12/1987 | Imamura et al. | 361/91 |
| 4,721,867 | 1/1988 | Taki | 307/270 |

FOREIGN PATENT DOCUMENTS 0080874  6/1983  European Pat. Off. ......... 307/296.4

OTHER PUBLICATIONS

Mano, M. Morris, Digital Integrated Circuits, pp. 569–574, 1979.

Primary Examiner—Stanley D. Miller
Assistant Examiner—Huy Kim Mai
Attorney, Agent, or Firm—Ladas & Parry

[57] ABSTRACT

This invention is related to an integrated driving circuit which can control high voltage and power, and more particularly to a high voltage and power driving circuit by employing BiCMOS technology. The principal object of this invention is to provide an integrated high voltage and high power driving circuit which is reliable by using BiCMOS technology without external discrete components. According to this invention, in the high voltage and power driving circuit using bipolar transistors and high voltage CMOS transistors, a high voltage and power driving circuit comprising: the current driving part composed of high voltage MOS transistor inverter and high current driving bipolar transistor 1 with the supply voltage of the certain multiple of breakdown voltage between collector and emitter of the bipolar transistor; the load driving part which drives the load with high current and high voltage of said certain multiple of the breakdown voltage which is composed of the high voltage MOS transistor inverter and the bipolar transistor 2; the reference voltage generation part which divides said certain multiple supply voltage into the breakdown voltages to prevent the bipolar transistors 1 and 2 from breaking down between the collector and the emitter; the reference voltage transfer part which transfers said reference voltage to the connection point of said bipolar transistor 1 and 2 by the switching action of the high voltage MOS transistor depending on said CMOS level signal input; and the high voltage, high power driving circuit using BiCMOS whose feature is to use delay part to prevent the operation of said load driving part till the voltage at said connection point of the bipolar transistor 1 and 2 reaches the divided voltage in the reference voltage generation part.

3 Claims, 2 Drawing Sheets

HIGH VOLTAGE AND POWER BICMOS DRIVING CIRCUIT

This invention relates to an integrated driving circuit that can control high voltage and power and, more particularly, to a high voltage and power driving circuit employing BiCMOS technology.

High voltage and power driving circuits are widely used in motor- and speaker-driving circuits.

The conventional driving circuit usually employs CMOS IC (integrated circuit) or bipolar circuits. In a CMOS IC driving circuit, a large signal swing can be obtained using MOS transistors, which have a high breakdown voltage between drain and source, but it is difficult to drive large currents, i.e. provide high powers, due to low transconductance (gm) of the MOS transistors. In a driving circuit using bipolar circuits, in very large scale integration (VLSI), the transistors can handle large currents, but it is difficult to obtain a large signal swing, due to limited breakdown voltage between collector and emitter (LVCEO).

SUMMARY OF THE INVENTION

The principal object of the invention is, therefore, to provide an integrated high voltage and high power driving circuit, which is also reliable, by using BiCMOS technology, without external discrete components.

Another objective of the invention is to provide a circuit with a reduced number of external components, outside an integrated-circuit chip, by which loads are driven to high voltage and power.

BRIEF DESCRIPTION OF THE DRAWING

Detailed descriptions of the invention are given with reference to a drawing, wherein.

DETAILED DESCRIPTION OF THE EMBODIMENTS

Figure 1:
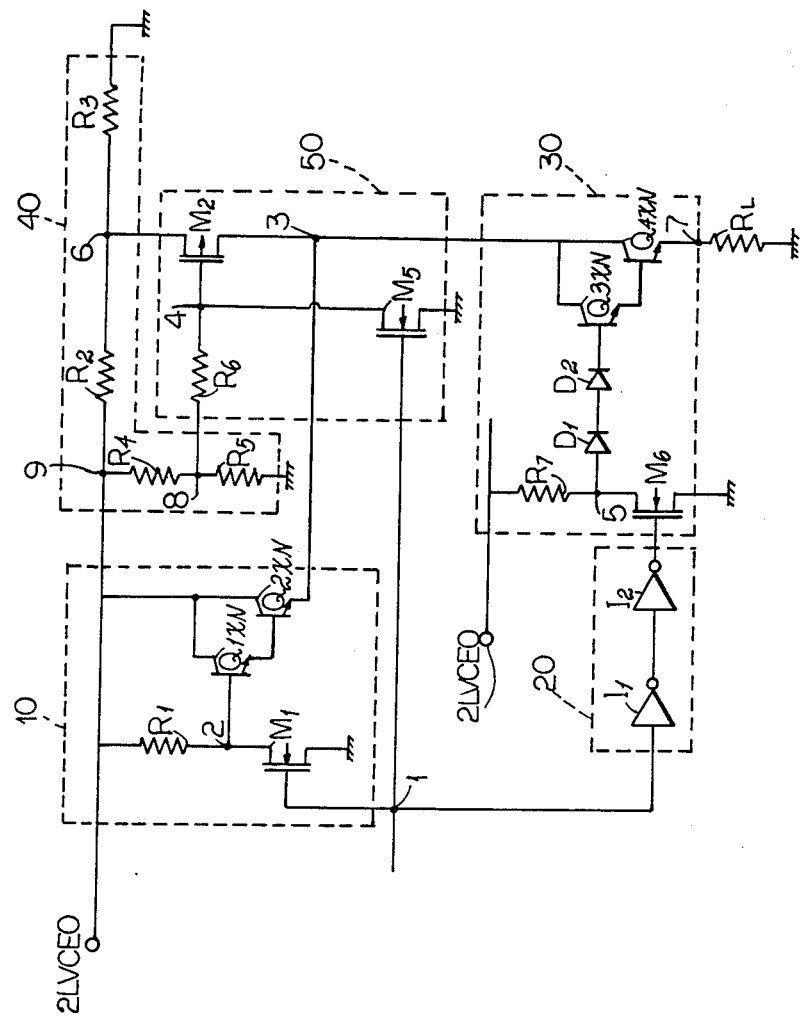
FIG. 1 is a circuit diagram of an embodiment of the invention.
Figure 2:
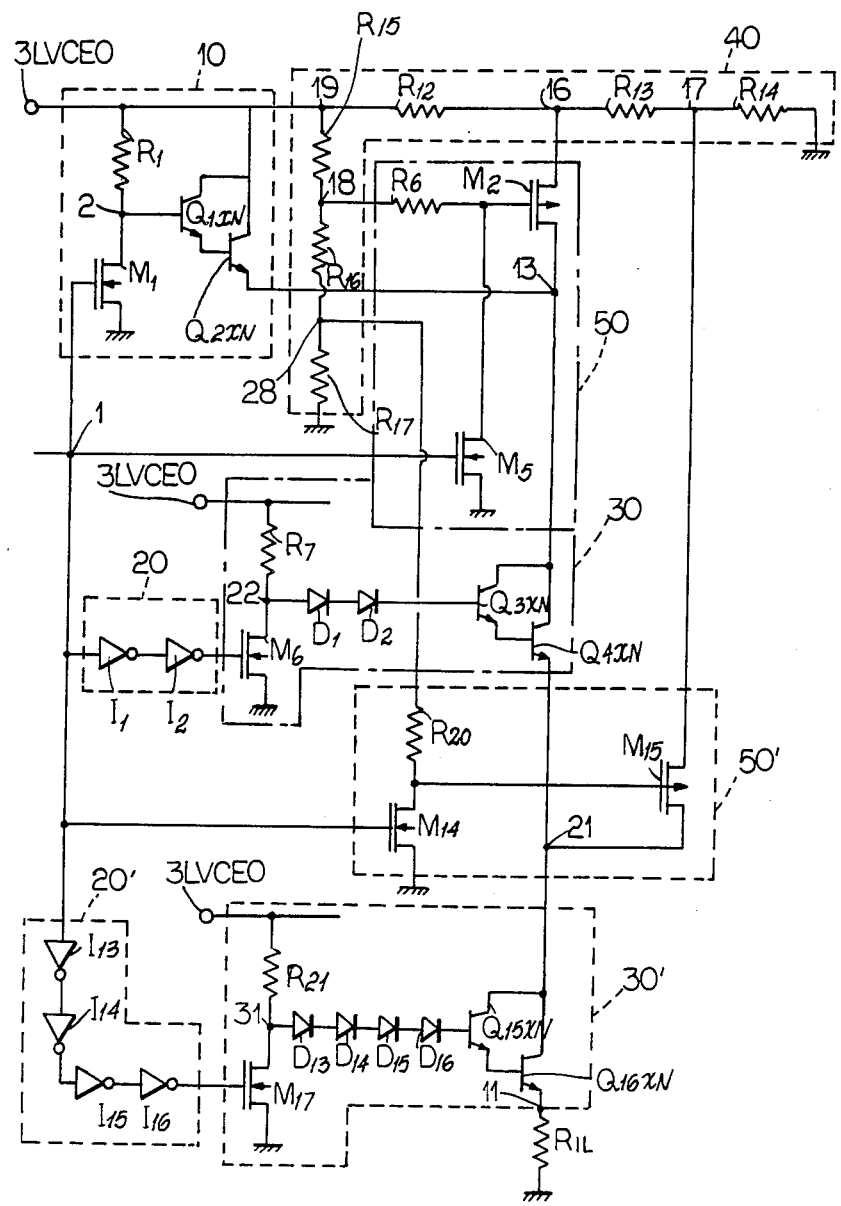
FIG. 2 is a circuit diagram of another, extended embodiment of the invention.

FIG. 1 is a circuit diagram of an embodiment of the invention where $R_1$-$R_7$ and $R_L$ are resistors, $Q_{1XN}$-$Q_{4XN}$ are bipolar transistors, $I_1$-$I_2$ are inverters, $M_1$-$M_6$ are high voltage MOS transistors, and $D_1$-$D_2$ are diodes. The four bipolar transistors shown are paired in two Darlington circuits, but the number of transistors actually in each Darlington circuit may be multiplied by an integer N, as indicated by the subscripts of their reference characters in keeping with a known referencing scheme, depending upon the current value to be obtained, as known for Darlington circuits.

In the circuit of FIG. 1, a large-current driving section 10 receives a CMOS-level signal from input port 1 at the gate of a high-voltage MOS transistor $M_1$. The drain node 2 of said high voltage MOS transistor $M_1$ is connected to a voltage supply port 2LVCEO (shown in duplicate in FIG. 1 for clarity) through a resistor $R_1$. Two bipolar transistor $Q_{1XN}$, $Q_{2XN}$ are cascaded as at least one Darlington pair with an input base also connected to the drain node 2 of the high voltage MOS transistor $M_1$ to supply a large current to node 3 for a load $R_L$.

In a delay section 20, the input port of an inverter $I_1$ is also connected to the CMOS-level signal input port 1. The output port of the inverter $I_1$ is connected to the input port of another inverter $I_2$, which also has an output port.

In a load driving section 30 the output port of the other inverter $I_2$, i.e. of said delay section 20, is connected to the gate of a high voltage MOS transistor $M_6$. The drain node 5 of said high voltage MOS transistor $M_6$ is connected to the voltage supply port 2LVCEO through load resistor $R_7$ and to the anode of a diode $D_1$. The cathode of said diode $D_1$ is connected to the anode of another diode $D_2$, and the cathode of diode $D_2$ is connected to the input base of another Darlington pair of transistors $Q_{3XN}$, $Q_{4XN}$, which are cascaded to augment the supply of the large current from the node 3 to a node 7 and the load, which is, in this case, resistor $R_L$.

In a reference voltage generation section 40, two sets of series-connected resistors $R_4$, $R_5$ and $R_2$, $R_3$ are connected in parallel. One end of the parallel sets of resistors (node 9) is connected to the voltage supply port 2LVCEO and the other end, is connected to ground.

In a reference voltage transport section 50, the CMOS-level signal input port 1 is connected to the gate of a high voltage MOS transistor $M_5$. The source of the high voltage MOS transistor $M_5$ is connected to ground, and the drain of the high voltage MOS transistor $M_5$ is connected to a node 4. The node 4 is connected to a center node 8 of the serially connected resistors $R_4$, $R_5$ of the reference voltage generation section 40 through a resistor $R_6$ of the reference voltage transport section 50 and the gate of another high voltage MOS transistor $M_2$ (more precisely a PMOS path transistor) also of the latter. The drain of the other high voltage MOS transistor $M_2$ is connected to a center node 6 of the serially connected resistor $R_2$, $R_3$ of the reference voltage generation section 40, and the source of the other high voltage MOS transistor $M_2$ is connected to the node 3. The node 3 is connected to the output port of the second-in-cascade bipolar transistor $Q_{2XN}$ of the large-current driving section 10, as well as to the collectors of the bipolar transistors $Q_{3XN}$, $Q_{4XN}$ of the load driving section 30, as previously described.

The operation of the embodiment of the invention of FIG. 1 is, therefore, explained in detail as follows:

When a CMOS-level, i.e. low-voltage, low-current input signal is applied to the CMOS-level signal input port 1 and logic-state swings from a "0" to a "1", for example, the voltage at the node 7 for the external load $R_L$ swings from 2LVCEO —4V BE volt to 0 volt with the bipolar transistors $Q_{2XN}$, $Q_{4XN}$ together providing a large current supply at the former voltage.

In other words, on the one hand, when a logic level "0" signal is applied to the CMOS-level signal input port 1, the high voltage MOS transistor $M_1$ turns off and the voltage at its drain node 2 goes to 2LVCEO. This 2LVCEO voltage turns on the bipolar transistors $Q_{1XN}$, $Q_{2XN}$ to node 3. The logic level "0" signal is also applied to the inverters $I_1$, $I_2$, and after passing through these, is applied to the high voltage MOS transistor $M_6$, which turns off the high voltage MOS transistor $M_6$. The voltage at the drain node 5 of the high voltage MOS transistor $M_6$ then goes to 2LVCEO. This voltage turns on the diodes $D_1$, $D_2$ and the bipolar transistors $Q_{3XN}$, $Q_{4XN}$ so that current flows in the load $R_L$ from node 3 through the transistors $Q_{3XN}$, $Q_{4XN}$. Then, the voltage at the node 7 to the external load $R_L$ is 2LVCEO—4V BE volt.

On the other hand, when a logic level "1" signal is applied to the CMOS-level signal input port 1 and, thus, the high voltage MOS transistor $M_1$, the high voltage MOS transistor $M_1$ turns on the MOS voltage at its drain node 2 goes to O volt. This turns off the bipolar transistors $Q_{1XN}$, $Q_{2XN}$. The logic level "1' signal is also applied to the inverters $I_1$, $I_2$, and after passing through these, is applied to the high voltage MOS transistor $M_6$, which turns on the high voltage MOS transistor $M_6$. The voltage at the drain node 5 of the high voltage $M_6$ goes to O volt. This turns off the diodes $D_1$, $D_2$ and the bipolar transistors $Q_{3XN}$, $Q_{4XN}$ so that no current flows in the load $R_L$. Then, the voltage across the load $R_L$ and, thus, at the node 7 becomes O volt.

As stated above, when the "1' signal to the CMOS-level signal input port 1, the bipolar transistors $Q_{2XN}$, $Q_{4XN}$ turn off, and the node 3 therefore goes to certain low voltage. When the voltage at the node 3 is less than LVCEO (i.e., 2LVCEO/2 and half of the applied voltage), breakdown of the bipolar transistor $Q_{2XN}$ would occur, and when greater, e.g. with the "0" signal, breakdown of the bipolar transistor $Q_{4XN}$ would occur.

To prevent such breakdown, i.e. maintain the voltage at the node 3 to be LVECO, the high voltage MOS transistor $M_5$ and PMOS path transistor $M_2$ are used. Thus, the "1' signal applied to the CMOS-level signal input port 1 is also applied to the high voltage MOS transistor $M_5$ to turn it on. This drops the voltage at the node 4 to O volt. This voltage, which is applied to the MOS transistor $M_2$, transfers the voltage at the node 6 to the node 3. When the registors $R_2$–$R_5$ are $R_2=R_3=R_4=R_5$, LVCEO voltage is so transferred to the node 3, and breakdown of the bipolar transistors $Q_{2XN}$, $Q_{4XN}$ is

What is claimed is:

1. A high voltage and power driving circuit, comprising:

voltage-supply means for providing a supply voltage;
   CMOS-level signal-input means for providing a CMOS-level input signal;
   large-current driving means comprising at least one first Darlington pair of bipolar transistors for providing a large current at a voltage from the supply voltage and a first high voltage MOS transistor for controlling the first pair of bipolar transistors in response to the input signal;
   delay means for receiving and delaying the input signal into a delayed input signal;
   load driving means comprising at least one second Darlington pair of bipolar transistors for providing to a load from the large current a larger current and a second high voltage MOS transistor for controlling the second pair of bipolar transistors in response to the delayed input signal;
   reference voltage means for providing a reference voltage from the supply voltage; and
   reference voltage transport means comprising two high voltage MOS transistors responsive, respectively, to the input signal and reference voltage for controlling, together, the voltage of the large current to prevent breakdown of the first and second pairs of bipolar transistors.

2. A high voltage and power driving circuit, comprising:

voltage-supply means for providing a supply voltage;
   CMOS-level signal-input means for providing a CMOS-level input signal,
   load driving means comprising at least one bipolar transistor having a collector and emitter and responsive to the CMOS-level input signal for providing to a load from at least a portion of the supply voltage a larger current signal corresponding to the CMOS-level input signal; and
   reference voltage transfer means comprising at least one high-voltage MOS transistor for providing the portion of the supply voltage to the load driving means such that a breakdown voltage of the collector and emitter of the bipolar transistor of the latter is not exceeded, whereby all the means may be on a BiCMOS device.

3. The high voltage and power driving circuit of claim 2, wherein the at least one bipolar transistor of the load driving means comprises at least one pair of bipolar transistors in at least one Darlington circuit.

* * * * *